United States Patent
Tian (10) Patent No.: US 10,797,128 B2
(45) Date of Patent: Oct. 6, 2020

(54) DISPLAY PANEL AND DEVICE

(71) Applicant: Wuhan China Star Optoelectronics Semiconductor Display Technology Co., Ltd., Wuhan, Hubei (CN)

(72) Inventor: Nian Tian, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/835,314

(22) Filed: Mar. 31, 2020

(65) Prior Publication Data

US 2020/0227514 A1 Jul. 16, 2020

Related U.S. Application Data (63) Continuation of application No. 16/136,601, filed on Sep. 20, 2018, now Pat. No. 10,636,862.

(30) Foreign Application Priority Data

Mar. 26, 2018 (CN) .......................... 2018 1 0250677

(51) Int. Cl.
  *G09G 3/36* (2006.01)
  *G06F 3/038* (2013.01)
  (Continued)

(52) U.S. Cl.
  CPC ....... *H01L 27/3276* (2013.01); *G09G 3/3266* (2013.01); *G09G 3/3275* (2013.01); *H01L 27/3211* (2013.01); *G09G 2300/0452* (2013.01)

(58) Field of Classification Search
  CPC .. G09G 3/36; G09G 3/00; G09G 3/32; G09G 3/20; G06F 3/038
  See application file for complete search history.

(56) References Cited

U.S. PATENT DOCUMENTS

| | | | | |
|---|---|---|---|---|
| 4,812,017 A | * | 3/1989 | Piper | ..................... G02F 1/1368 349/144 |
| 2013/0307868 A1 | * | 11/2013 | Jeong | ................... G09G 3/3258 345/600 |

(Continued)

FOREIGN PATENT DOCUMENTS

| CN | 206322697 U | 7/2017 |
|---|---|---|
| WO | 2014114178 A1 | 7/2014 |

*Primary Examiner* — Pegeman Karimi
(74) *Attorney, Agent, or Firm* — Leong C. Lei (57) ABSTRACT

A display panel and a display device wherein the display panel includes multiple parallel scan lines and data lines crossing and insulated from each other. A nth scan line, a (n+1)th scan line, a mth data line, and a (m+1)th data line jointly define a first pixel area. The nth scan line, the (n+1)th scan line, a (m+2)th data line, and a (m+3)th data line jointly define a second pixel area. The nth scan line, the (n+1)th scan line, a (m+4)th data line, and a (m+5)th data line jointly define a third pixel area. Each of the first, second, and third pixel areas includes a number of sub-pixel units. The sub-pixel units in the first and third pixel areas are disposed in a structurally symmetric manner relative to the second pixel area. The present invention may reduce the complexity of designing the driving IC to the sub-pixel units.

10 Claims, 8 Drawing Sheets

(51) Int. Cl.
*H01L 27/32* (2006.01)
*G09G 3/3266* (2016.01)
*G09G 3/3275* (2016.01)

(56) References Cited

U.S. PATENT DOCUMENTS

2016/0197123 A1    7/2016  Sung
2016/0240593 A1*  8/2016  Gu ........................ G09G 3/3225
2018/0033383 A1*  2/2018  Kim ..................... G09G 3/3607

* cited by examiner

DISPLAY PANEL AND DEVICE

CROSS-REFERENCE TO RELATED APPLICATIONS

This application is a continuing application of co-pending U.S. patent application Ser. No. 16/136,601, filed on Sep. 20, 2018, which is a continuing application of PCT Patent Application No. PCT/CN2018/092249, filed on Jun. 21, 2018, which claims priority to Chinese Patent Application No. 201810250677.9, filed on Mar. 26, 2018, both of which are hereby incorporated herein by reference in their entireties.

FIELD OF THE INVENTION

The present invention is generally related to the field of display technology, and more particularly to a display panel and a display device.

BACKGROUND OF THE INVENTION

Organic light emitting diode (OLED) display device has become the mainstream for the new generation of flat panel displays due to the various advantages such as light weight, thin thickness, self-illumination, fast response, wide viewing angle, wide gamut, high brightness, and low power consumption. However, there are still numerous challenges to achieve high-quality and high-resolution OLED display device to meet ever-increasing market demands.

Sub pixel rendering (SPR) is a technique to enhance resolution by having neighboring pixels to share some common sub-pixels. The two-in-one arrangement is a common SPR approach where sub-pixels of a same color may share a single metallic mask aperture. The manufacturing is relatively simple, and has a longer operation life under identical manufacturing condition. However, the driving integrated circuit (IC) becomes more complicated compared to a traditional design as driving has to be conducted from different directions and the driving logic is different.

SUMMARY OF THE INVENTION

The present invention teaches a display panel comprising a plurality of parallel scan lines at intervals and a plurality of parallel data lines at intervals, wherein the data lines and the scan lines cross each other and are insulated from each other; a nth scan line, a (n+1)th scan line, a mth data line, and a (m+1)th data line jointly define a first pixel area; the nth scan line, the (n+1)th scan line, a (m+2)th data line, and a (m+3)th data line jointly define a second pixel area; the nth scan line, the (n+1)th scan line, a (m+4)th data line, and a (m+5)th data line jointly define a third pixel area; each of the first, second, and third pixel areas has at least a sub-pixel unit; the one or more sub-pixel units in the first pixel area and the one or more sub-pixel units in the third pixel area are disposed in a structurally symmetric manner relative to the second pixel area; n is a positive integer greater than or equal to 1; and m is a positive integer greater than or equal to 1.

Compared to the prior art, he present invention teaches a display panel comprising a plurality of parallel scan lines at intervals and a plurality of parallel data lines at intervals, wherein the data lines and the scan lines cross each other and are insulated from each other; a nth scan line, a (n+1)th scan line, a mth data line, and a (m+1)th data line jointly define a first pixel area; the nth scan line, the (n+1)th scan line, a (m+2)th data line, and a (m+3)th data line jointly define a second pixel area; the nth scan line, the (n+1)th scan line, a (m+4)th data line, and a (m+5)th data line jointly define a third pixel area; each of the first, second, and third pixel areas has at least a sub-pixel unit; the one or more sub-pixel units in the first pixel area and the one or more sub-pixel units in the third pixel area are disposed in a structurally symmetric manner relative to the second pixel area. Therefore, the display panel may drive sub-pixel units starting from the first pixel area according to a same driving logic as the display panel drives the sub-pixel units starting from the third pixel area. As such, the sub-pixels may be driven by a same driving IC, the complexity of the driving IC to the sub-pixel units is reduced, and the design of the driving IC then would be less difficult.

The present invention also teaches a display device, comprising a display panel as described above.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
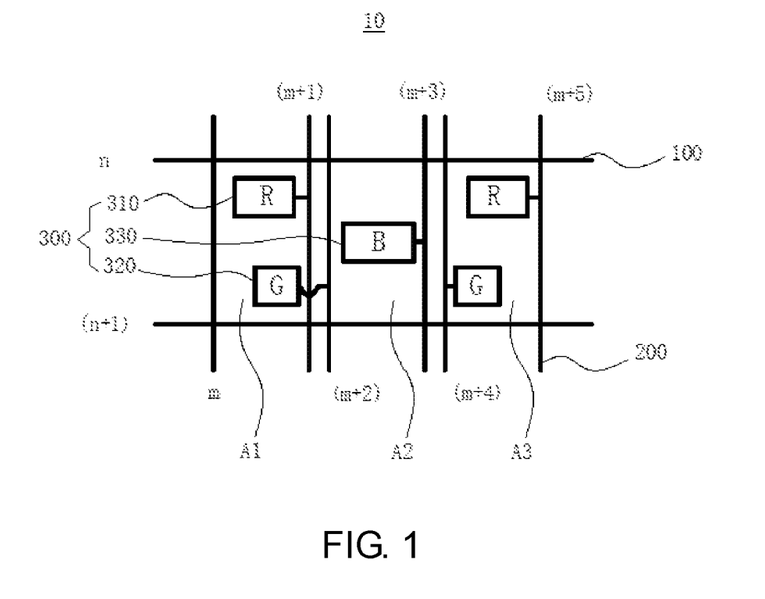
FIG. 1 is a structural schematic diagram of a display panel according to a first embodiment of the present invention.

FIG. 1 is a structural schematic diagram of a display panel 10 according to a first embodiment of the present invention. As shown in FIG. 1, the display panel 10 includes multiple parallel scan lines 100 at intervals and multiple parallel data lines 200 at intervals. The data lines 200 and the scan lines 100 cross each other and are insulated from each other. A nth scan line 100, a (n+1)th scan line 100, a mth data line 200, and a (m+1)th data line 200 jointly define a first pixel area A1. The nth scan line 100, the (n+1)th scan line 100, a (m+2)th data line 200, and a (m+3)th data line 200 jointly define a second pixel area A2. The nth scan line 100, the (n+1)th scan line 100, a (m+4)th data line 200, and a (m+5)th data line 200 jointly define a third pixel area A3. Each of the first, second, and third pixel areas A1, A2, and A3 includes a number of sub-pixel units 300. Each sub-pixel unit 300 includes a first sub-pixel 310, a second sub-pixel 320, and a third sub-pixel 330. The sub-pixel units 300 in the first pixel area A1 and the sub-pixel units 300 of the third pixel area A3 are disposed in a structurally symmetric manner relative to the second pixel area A2. n is a positive integer greater than or equal to 1, m is a positive integer greater than or equal to 1.

For example, the scan lines 100 are extended along a first direction and arranged at intervals along a second direction. The data lines 200 are extended along the second direction and arranged at intervals along the first direction. The data lines 200 and the scan lines 100 are insulated from each other. The first direction may be the X or Y direction. The second direction may also be the X or Y direction. When the first direction is X, the second direction is Y. When the first direction is Y, the second direction is X. The present embodiment has the first direction as the X direction, and the second direction as the Y direction.

The first, second, and third pixel areas A1, A2, and A3 are light generation areas. Each sub-pixel unit 300 in the first pixel area A1 may be a red sub-pixel (R), a green sub-pixel (G), or a blue sub-pixel (B). Correspondingly, the first pixel area A1 covers a color resist layer of a same color as its sub-pixel. For example, if the first pixel area A1 has a red sub-pixel, the first pixel area A1 covers the red color resist. Each sub-pixel unit 300 of the second pixel area A2 may be a red sub-pixel (R), a green sub-pixel (G), or a blue sub-pixel (B). Correspondingly, the second pixel area A2 covers a color resist layer of a same color as its sub-pixel. For example, if the second pixel area A2 has a green sub-pixel, the second pixel area A2 covers the green color resist.

Each sub-pixel unit 300 includes a first sub-pixel 310, a second sub-pixel 320, and a third sub-pixel 330. The sub-pixel units 300 in the first pixel area A1 and the sub-pixel units 300 of the third pixel area A3 are structurally disposed in a symmetric manner relative to the second pixel area A2. Therefore, the display panel 10 may drive sub-pixel units 300 starting from the first pixel area A1 in a same manner as the display panel 10 drives the sub-pixel units 300 starting from the third pixel area A3. As such, the complexity of the driving IC for the display panel 10 to the sub-pixel units 300 is reduced, and the design of the driving IC then would be less difficult.

In the present embodiment, a second sub-pixel 320 electrically connect to the (m+2)th data line 200 is disposed in the first pixel area A1, and another second sub-pixel 320 electrically connect to the (m+4)th data line 200 is disposed in the third pixel area A3.

Specifically, in the present embodiment, when the first, second, and third sub-pixels 310, 320, and 330 are red, green, and blue sub-pixels, respectively, two second sub-pixels 320 are respectively disposed symmetrically in the first and third pixel areas A1 and A3 relative to the second pixel area A2, so as to maintain the symmetry between the sub-pixel units 300 of the first and second pixel areas A1 and A3 relative to the second pixel area A2.

As described above, the present invention teaches a display panel including multiple parallel scan lines at intervals and multiple parallel data lines at intervals. The data lines and the scan lines cross each other and are insulated from each other. A nth scan line, a (n+1)th scan line, a mth data line, and a (m+1)th data line jointly define a first pixel area. The nth scan line, the (n+1)th scan line, a (m+2)th data line, and a (m+3)th data line jointly define a second pixel area. The nth scan line, the (n+1)th scan line, a (m+4)th data line, and a (m+5)th data line jointly define a third pixel area. Each of the first, second, and third pixel areas includes a number of sub-pixel units. The sub-pixel units in the first pixel area and the sub-pixel units in the third pixel area are disposed in a structurally symmetric manner relative to the second pixel area. Therefore, the display panel may drive sub-pixel units starting from the first pixel area according to a same driving logic as the display panel drives the sub-pixel units starting from the third pixel area. As such, the sub-pixel units may be driven by a same driving IC, the complexity of the driving IC to the sub-pixel units is reduced, and the design of the driving IC then would be less difficult.

Figure 2:
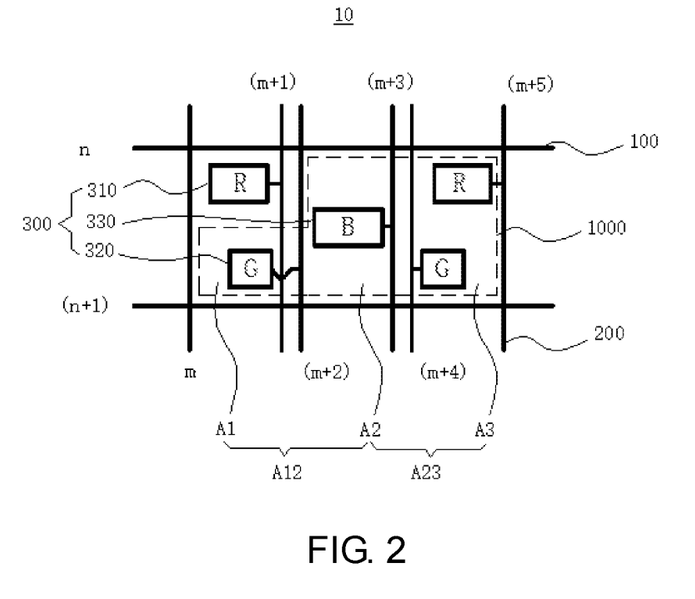
FIG. 2 is a structural schematic diagram of a display panel according to a second embodiment of the present invention.

FIG. 2 is a structural schematic diagram of a display panel 10 according to a second embodiment of the present invention. As shown in FIG. 2, the present embodiment is generally structured identically to the previous embodiment. The difference lies in that the first pixel area A1 and the second pixel area A2 jointly form a first area A12, which has a first sub-pixel 310, a second sub-pixel 320, and a third sub-pixel 330. Alternatively, the second pixel area A2 and the third pixel area A3 jointly form a second area A23, which has a first sub-pixel 310, a second sub-pixel 320, and a third sub-pixel 330.

Specifically, in the present embodiment, the first and second pixel areas A1 and A2 jointly form a first area A12, and the first area A12 has a first sub-pixel 310, a second sub-pixel 320, and a third sub-pixel 330.

As the sub-pixel units 300 in the first pixel area A1 and the sub-pixel units 300 of the third pixel area A3 should be disposed in a structurally symmetric manner relative to the second pixel area A2, the second and third pixel areas A2 and A3 jointly form a second area A23, and the second area A23 has a first sub-pixel 310, a second sub-pixel 320, and a third sub-pixel 330.

Specifically, the first sub-pixel 310 is a red sub-pixel (R), the second sub-pixel 320 is a green sub-pixel (G), and the third sub-pixel 330 is a blue sub-pixel (B). A first sub-pixel 310, two second sub-pixels 320, and a third sub-pixel 330 jointly form a pixel group 1000.

Specifically, when the first sub-pixel 310, the second sub-pixel 320, and the third sub-pixel 330 are respectively red, green, and blue sub-pixels, a first sub-pixel 310, two second sub-pixels 320, and a third sub-pixel 330 jointly form a pixel group 1000. In other words, a pixel group 1000 includes (¼)R, (²⁄₄)G, and (¼)B four sub-pixel units 300. This is because human eye is most sensitive to the color green, and therefore each pixel group 1000 includes two green sub-pixels for enhanced visual effect.

Specifically, in the present embodiment, the (m+1)th data line 200 is electrically connected to a first sub-pixel 310, the (m+2)th data line 200 is electrically connected to a second sub-pixel 320, the (m+3)th data line 200 is electrically connected to the third sub-pixel 330, the (m+4)th data line 200 is electrically connected to another second sub-pixel 320. The (m+1)th, (m+2)th, (m+3)th, and (m+4)th data lines 200 jointly drives a pixel group 1000.

Furthermore, to drive a pixel group 1000, four separate data lines are required. Then, as described above, when the first sub-pixel 310, the second sub-pixel 320, and the third sub-pixel 330 are respectively red, green, and blue sub-pixels, a first sub-pixel 310, two second sub-pixels 320, and a third sub-pixel 330 jointly form a pixel group 1000. Each pixel group 1000 therefore includes a red sub-pixel, two green sub-pixels, and a blue sub-pixel. Then, the (m+1)th data line 200 is electrically connected to a red sub-pixel, the (m+2)th data line 200 is electrically connected to a green sub-pixel, the (m+3)th data line 200 is electrically connected to a blue sub-pixel 330, and the (m+4)th data line 200 is electrically connected to another green sub-pixel. As such, the (m+1)th, (m+2)th, (m+3)th, and (m+4)th data lines 200 jointly drives a pixel group 1000.

Furthermore, according to FIG. 2, when driving starts from the first pixel area A1, the sub-pixel units 300 are driven in the order RGBG/RGBG and, when driving starts from the third pixel area A3, the sub-pixel units 300 are driving in the same order RGBG/RGBG. In other words, a same driving logic is applied when the display panel 10 drives the sub-pixel units 300 from its upper left corner, or when the display panel 10 drives the sub-pixel units 300 from its upper right corner. Therefore, a same driving IC may be used to drive the sub-pixel units 300. The driving IC for the sub-pixel units 300 may be simplified accordingly, reducing the difficulty in designing the driving IC.

Selectively, the second sub-pixel 320 electrically connected to the (m+2)th data line 200 is disposed in the first pixel area A1, and another second sub-pixel 320 electrically connected to the (m+4)th data line 200 is disposed in the third pixel area A3.

Specifically, in the present embodiment, when the first, second, and third sub-pixels 310, 320, and 330 are red, green, and blue sub-pixels, respectively, two second sub-pixels 320 are respectively disposed symmetrically in the first and third pixel areas A1 and A3 relative to the second pixel area A2, so as to maintain the symmetry between the sub-pixel units 300 of the first and second pixel areas A1 and A3 relative to the second pixel area A2.

Figure 3:
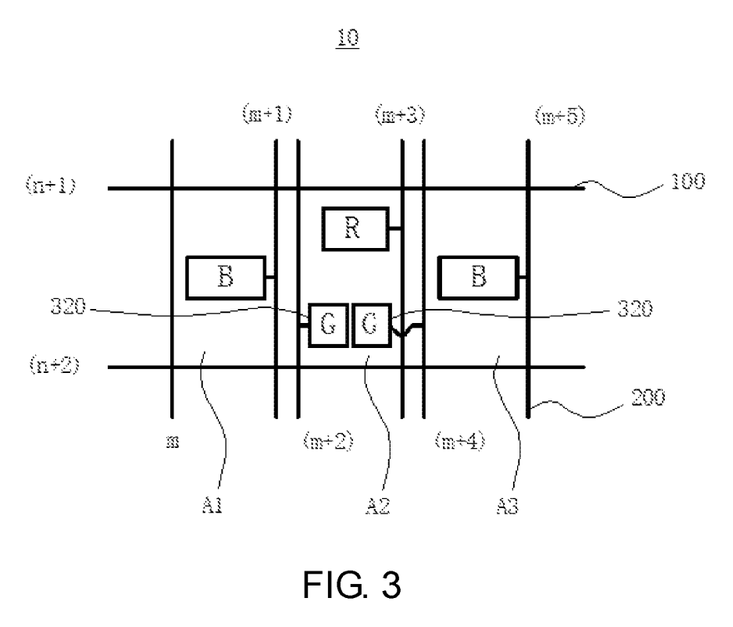
FIG. 3 is a structural schematic diagram of a display panel according to a third embodiment of the present invention.

FIG. 3 is a structural schematic diagram of a display panel 10 according to a third embodiment of the present invention. As illustrated, the present embodiment is generally structured identically to the first embodiment. The difference lies in that the second sub-pixels 320 electrically connected to the (m+2)th and (m+4)th data lines 200 are both disposed in the second pixel area A2, as shown in the area delimited by the (n+1)th and (n+2)th scan lines.

Specifically, in the present embodiment, when the first, second, and third sub-pixels 310, 320, and 330 are red, green, and blue sub-pixels, respectively, and two second sub-pixels 320 electrically connected to the (m+2)th and (m+4)th data lines 200, respectively, are both disposed in the second pixel area A2. In this way, the two second sub-pixels 320 are adjacent to each other and they may be simultaneously formed in a single process, thereby reducing manufacturing complexity and production cost. In addition, as the two second sub-pixels 320 are both disposed in the second pixel area A2, they may be formed through a single metallic mask aperture for enhanced simplicity.

Selectively, one embodiment has a first sub-pixel 310 and a second sub-pixel 320 both disposed in the first pixel area A1. Alternatively, another embodiment may have a first sub-pixel 310 and a second sub-pixel 320 both disposed in the second pixel area A2.

Specifically, the first, second, and third sub-pixels 310, 320, and 330 are red, green, and blue sub-pixels, respectively, there are three pixel areas, namely, the first pixel area A1, the second pixel area A2, and the third pixel area A3, each of the first, second, and third pixel areas A1, A2, and A3 includes at least a sub-pixel unit 300, the first, second, and third pixel areas A1, A2, and A3 provides at least a pixel group 1000, and a pixel group 1000 includes a red sub-pixel, two green sub-pixels, and a blue sub-pixel. Then, according to common combinatorics knowledge, one embodiment may have a first sub-pixel 310 and a second sub-pixel 320 both in the first pixel area A1. Alternatively, another embodiment may have a first sub-pixel 310 and a second sub-pixel 320 both in the second pixel area A2. It should be understandable that, due to the symmetry between the sub-pixel units 300 of the first and second pixel areas A1 and A3 relative to the second pixel area A2, an embodiment may have a first sub-pixel 310 and a second sub-pixel 320 both in the third pixel area A3.

Selectively, in one embodiment, each second sub-pixel 320 has an area smaller than that of each first sub-pixel 310, and also smaller than that of each third sub-pixel 330, and each first sub-pixel 310 has an area smaller than that of each third sub-pixel 330.

Specifically, when the first, second, and third sub-pixels 310, 320, and 330 are red, green, and blue sub-pixels, respectively, the green sub-pixel has the smallest area, the blue sub-pixel has the largest area, and the red sub-pixel has a medium area size, as the green sub-pixel has the highest lighting efficiency, the blue sub-pixel has the worst lighting efficiency, and the red sub-pixel has a medium light efficiency. Through this arrangement of area sizes, the first, second, and third sub-pixels 310, 320, and 330 may provide an optimized visual effect, thereby enhancing the display quality of the display panel 10.

Figure 4:
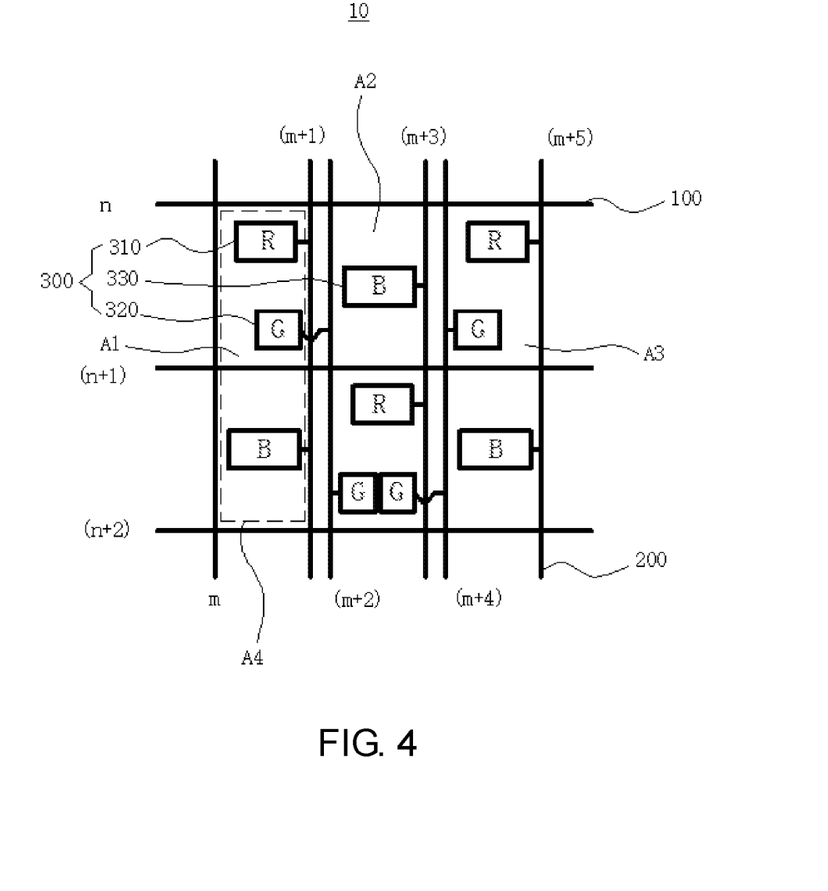
FIG. 4 is a structural schematic diagram of a display panel according to a fourth embodiment of the present invention.

FIG. 4 is a structural schematic diagram of a display panel 10 according to a fourth embodiment of the present invention. As illustrated, the present embodiment is generally structured identically to the first embodiment. The difference lies in that a nth scan line 100, a (n+2)th scan line 100, a mth data line 200, and a (m+1)th data line 200 jointly define a fourth pixel area A4, which includes a first sub-pixel 310, a second sub-pixel 320, and a third sub-pixel 330.

Figure 5:
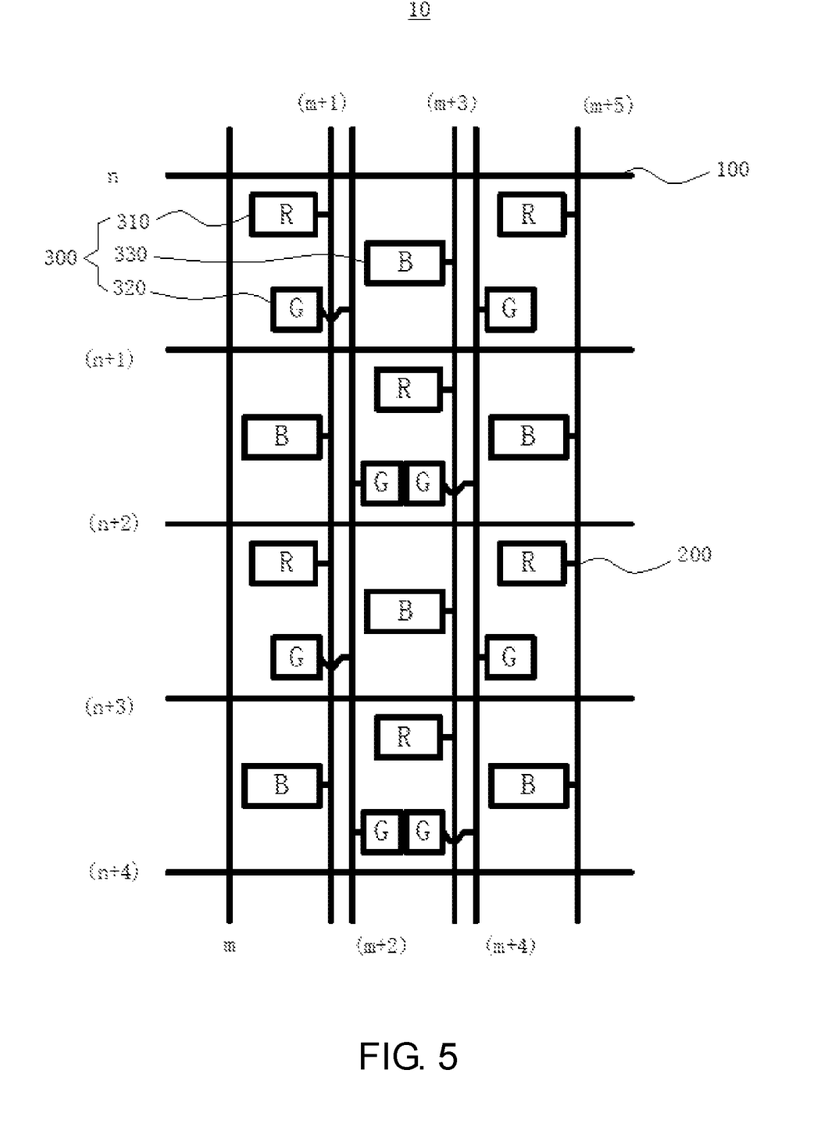
FIG. 5 is a structural schematic diagram of a display panel according to a fifth embodiment of the present invention.

FIG. 5 is a structural schematic diagram of a display panel 10 according to a fifth embodiment of the present invention. As illustrated, the present embodiment is generally structured identically to the fourth embodiment. The difference lies in that, in the present embodiment, the sub-pixel units 300 are arranged in a repetitive manner duplicating a pattern between a nth scan line 100, a (n+1)th scan line 100, and a (n+2)th scan line 100. Specifically, the nth scan line 100, the (n+1)th scan line 100, the (n+2)th scan line 100, a (n+3)th scan line 100, and a (n+4)th scan line 100, and a mth data line 200, a (m+1)th data line 200, a (m+2)th data line 200, a (m+3)th data line 200, a (m+4)th data line 200, and a (m+5)th data line jointly define the display panel 10. The display panel 10 drives the sub-pixel unit 300 from the upper left corner in the order RGBG/RGBG. The display panel 10 drives the sub-pixel unit 300 from the upper right corner also in the order RGBG/RGBG. The display panel 10 drives the sub-pixel unit 300 from the lower left corner in the order BGRG/BGRG. The display panel 10 drives the sub-pixel unit 300 from the lower right corner also in the order BGRG/BGRG. In other words, the display panel 10 drives the sub-pixel units 300 from its upper left corner in a same manner as when the display panel 10 drives the sub-pixel units 300 from its upper right corner, both in the order RGBG/RGBG. Similarly, the display panel 10 drives the sub-pixel units 300 from its lower left corner in a same manner as when the display panel 10 drives the sub-pixel units 300 from its lower right corner, both in the order BGRG/BGRG. Therefore, the driving IC for the sub-pixel units 300 may be simplified accordingly, reducing the difficulty in designing the driving IC. Furthermore, the sub-pixel units 300 in an area defined by the mth and (m+1)th data lines 200 and the sub-pixel units 300 in an area defined by the (m+4)th and (m+5)th data lines 200 are disposed in a structurally symmetric manner relative to an area defined by the (m+2)th and (m+3)th data lines 200. Therefore, the present invention may improve the phenomenon of colored edges from sub-pixel units 300 to the display panel 10's left and right sides, thereby enhancing the display quality of the display panel 10.

The display panel taught by the present invention, as the sub-pixel units in the first pixel area and the sub-pixel units in the third pixel area are structurally disposed in a symmetric manner relative to the second pixel area, may drive sub-pixel units starting from the first pixel area in a same manner as the display panel drives the sub-pixel units starting from the third pixel area. Therefore, a same driving IC may be used to drive the sub-pixel units. The driving IC for the sub-pixel units may be simplified accordingly, reducing the difficulty in designing the driving IC.

Figure 6:
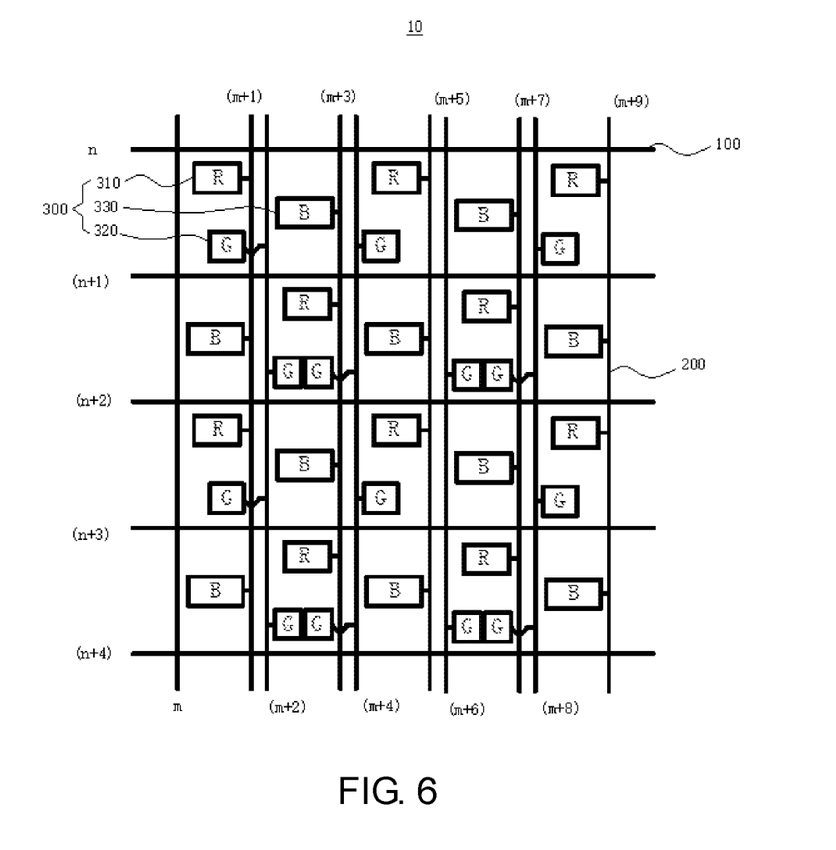
FIG. 6 is a structural schematic diagram of a display panel according to a sixth embodiment of the present invention.

FIG. 6 is a structural schematic diagram of a display panel 10 according to a sixth embodiment of the present invention. As illustrated, the present embodiment is generally structured identically to the fifth embodiment. The difference lies in that, in the present embodiment, the sub-pixel units 300 are arranged in a repetitive manner duplicating a pattern between a (m+2)th data line 200, a (m+3)th data line 200, a (m+4)th data line 200, and a (m+5)th data line 200. Specifically, the nth scan line 100, the (n+1)th scan line 100, the (n+2)th scan line 100, a (n+3)th scan line 100, and a (n+4)th scan line 100, and a mth data line 200, a (m+1)th data line 200, the (m+2)th data line 200, the (m+3)th data line 200, the (m+4)th data line 200, the (m+5)th data line, a (m+6)th data line 200, a (m+7)th data line 200, a (m+8)th data line 200, and a (m+9)th data line 200 jointly define the display panel 10. The display panel 10 drives the sub-pixel unit 300 from the upper left corner in the order RGBG/RGBG. The display panel 10 drives the sub-pixel unit 300 from the upper right corner also in the order RGBG/RGBG. The display panel 10 drives the sub-pixel unit 300 from the lower left corner in the order BGRG/BGRG. The display panel 10 drives the sub-pixel unit 300 from the lower right corner also in the order BGRG/BGRG. In other words, the display panel 10 drives the sub-pixel units 300 from its upper left corner in a same manner as when the display panel 10 drives the sub-pixel units 300 from its upper right corner, both in the order RGBG/RGBG. Similarly, the display panel 10 drives the sub-pixel units 300 from its lower left corner in a same manner as when the display panel 10 drives the sub-pixel units 300 from its lower right corner, both in the order BGRG/BGRG. Therefore, the driving IC for the sub-pixel units 300 may be simplified accordingly, reducing the difficulty in designing the driving IC. Furthermore, the sub-pixel units 300 in an area defined by the mth and (m+1)th data lines 200 and the sub-pixel units 300 in an area defined by the (m+4)th and (m+5)th data lines 200 are disposed in a structurally symmetric manner relative to an area defined by the (m+2)th and (m+3)th data lines 200. Therefore, the present invention may improve the phenomenon of colored edges from sub-pixel units 300 to the display panel 10's left and right sides, thereby enhancing the display quality of the display panel 10.

The display panel taught by the present invention, as the sub-pixel units in the first pixel area and the sub-pixel units in the third pixel area are structurally disposed in a symmetric manner relative to the second pixel area, may drive sub-pixel units starting from the first pixel area in a same manner as the display panel drives the sub-pixel units starting from the third pixel area. Therefore, a same driving IC may be used to drive the sub-pixel units. The driving IC for the sub-pixel units may be simplified accordingly, reducing the difficulty in designing the driving IC.

Figure 7:
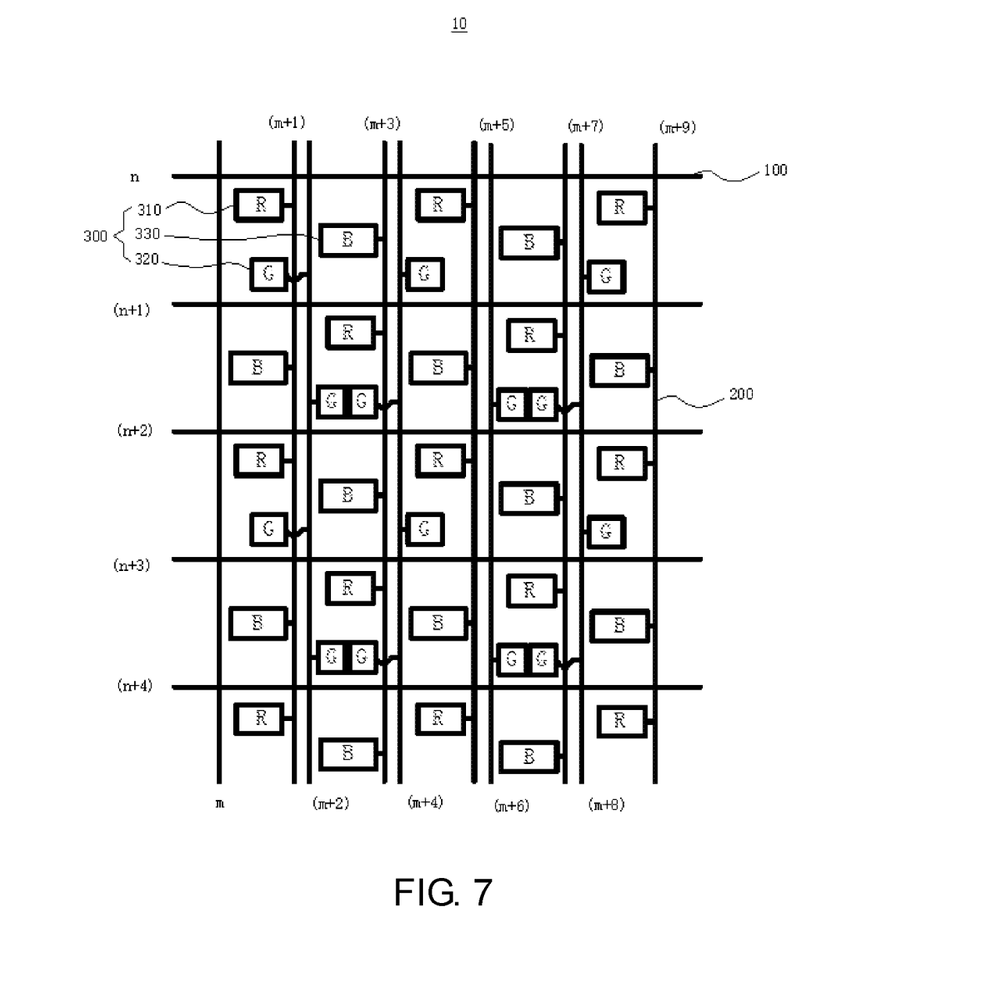
FIG. 7 is a structural schematic diagram of a display panel according to a seventh embodiment of the present invention.

FIG. 7 is a structural schematic diagram of a display panel 10 according to a seventh embodiment of the present invention. As illustrated, the present embodiment is generally structured identically to the sixth embodiment. The difference lies in that, in the present embodiment, two additional rows of sub-pixel units 300 are disposed as the bottommost rows to the display panel 10. The two rows of the sub-pixel units 300 are identical to the top two rows of the three rows of sub-pixel units 300 between the nth and (n+1)th scan lines 100. The display panel 10 then drives the sub-pixel unit 300 from the upper left corner in the order RGBG/RGBG. The display panel 10 drives the sub-pixel unit 300 from the upper right corner also in the order RGBG/RGBG. The display panel 10 drives the sub-pixel unit 300 from the lower left corner also in the order RGBG/RGBG. The display panel 10 drives the sub-pixel unit 300 from the lower right corner also in the order RGBG/RGBG. In other words, the display panel 10 drives the sub-pixel units 300 from its upper left corner in a same manner as when the display panel 10 drives the sub-pixel units 300 from its upper right, lower left, or left right corner, all in the order RGBG/RGBG. Therefore, the driving IC for the sub-pixel units 300 may be simplified accordingly, reducing the difficulty in designing the driving IC. Furthermore, by adding two additional rows of sub-pixel units 300 as the bottommost rows to the display panel 10, the present invention may improve the phenomenon of colored edges from sub-pixel units 300 to the display panel 10's bottom side, thereby enhancing the display quality of the display panel 10.

The display panel taught by the present invention drives sub-pixel units in a same manner regardless of whether starting from the upper left or upper right corner, or from the lower left or lower right corner. Therefore, a same driving IC may be used to drive the sub-pixel units. The driving IC for the sub-pixel units may be simplified accordingly, reducing the difficulty in designing the driving IC. Furthermore, two additional rows of sub-pixel units as the bottommost rows to the display panel improve the phenomenon of colored edges from sub-pixel units to the display panel 10's bottom side, thereby enhancing the display quality of the display panel 10.

Figure 8:
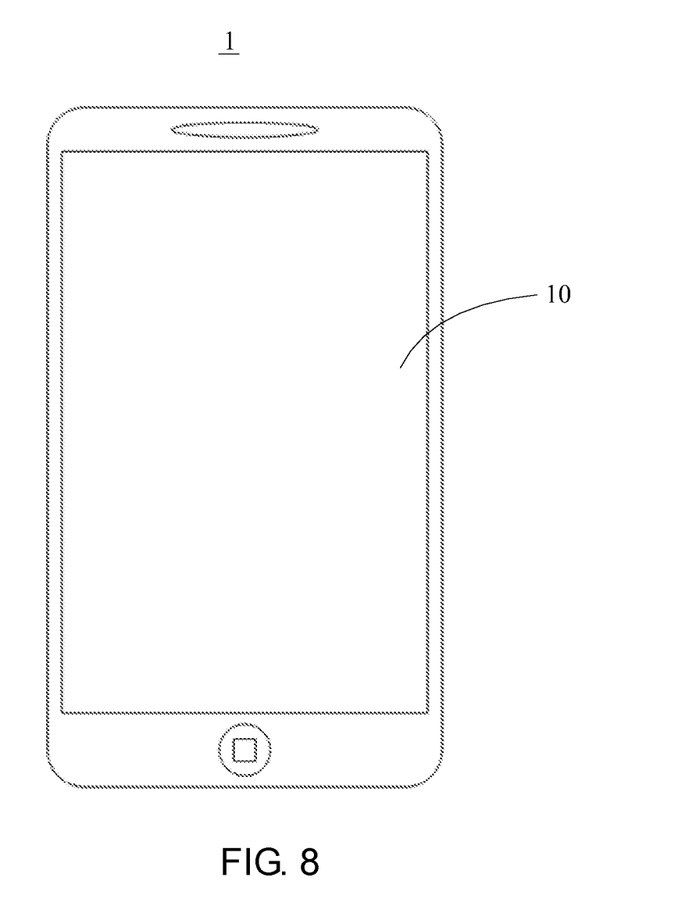
FIG. 8 shows a display device according to an embodiment of the present invention.

FIG. 8 shows a display device 1 according to an embodiment of the present invention. As illustrated, the display device 1 includes a display panel 10 according to one of the above described embodiments. Its details are omitted. The display device 1 may be, but not limited to, an electronic book, a smart phone (e.g., an Android phone, iOS phone, Windows phone), a digital TV, a tablet computer, a handheld computer, a notebook computer, a mobile Internet device (MID), or a wearable device.

Above are embodiments of the present invention, which does not limit the scope of the present invention. Any equivalent amendments within the spirit and principles of the embodiment described above should be covered by the protected scope of the invention.

What is claimed is:

1. A display panel for an organic light emitting diode (OLED) display device, comprising a plurality of parallel scan lines at intervals and a plurality of parallel data lines at intervals, wherein the data lines and the scan lines cross each other and are insulated from each other; a nth scan line, a (n+1)th scan line, a mth data line, and a (m+1)th data line jointly define a first pixel area; the nth scan line, the (n+1)th scan line, a (m+2)th data line, and a (m+3)th data line jointly define a second pixel area; the nth scan line, the (n+1)th scan line, a (m+4)th data line, and a (m+5)th data line jointly define a third pixel area; each of the first, second, and third pixel areas has at least a sub-pixel unit; the one or more sub-pixel units in the first pixel area and the one or more sub-pixel units in the third pixel area are disposed in a structurally symmetric manner relative to the second pixel area; n is a positive integer greater than or equal to 1; and m is a positive integer greater than or equal to 1; wherein each sub-pixel unit comprises a first sub-pixel, a second sub-pixel, and a third sub-pixel; the first, second, and third sub-pixels are different; the first pixel area and the second pixel area jointly form a first area which has a first sub-pixel, a second sub-pixel, and a third sub-pixel; or the second pixel area and the third pixel area jointly form a second area which has a first sub-pixel, a second sub-pixel, and a third sub-pixel; wherein each first sub-pixel is a red sub-pixel; each second sub-pixel is a green sub-pixel; each third sub-pixel is a blue sub-pixel; and a first sub-pixel, two second sub-pixels, and a third sub-pixel jointly form a pixel group; wherein the second sub-pixel electrically connect to the (m+2)th data line is disposed in the second pixel area; and the second sub-pixel electrically connect to the (m+4)th data line is disposed in the second pixel area.

2. The display panel according to claim 1, wherein the (m+1)th data line is electrically connected to a first sub-pixel; the (m+2)th data line is electrically connected to a second sub-pixel; the (m+3)th data line is electrically connected to a third sub-pixel; the (m+4)th data line is electrically connected to another second sub-pixel; and the (m+1)th, (m+2)th, (m+3)th, and (m+4)th data lines jointly drive a pixel group.

3. The display panel according to claim 1, wherein a first sub-pixel and a second sub-pixel are both disposed in the first pixel area, or a first sub-pixel and a second sub-pixel are both disposed in the second pixel area.

4. The display panel according to claim 1, wherein each second sub-pixel has an area smaller than that of each first sub-pixel and also smaller than that of each third sub-pixel; and each first sub-pixel has an area smaller than that of each third sub-pixel.

5. The display panel according to claim 1, wherein a nth scan line, a (n+2)th scan line, a mth data line, and a (m+1)th data line jointly define a fourth pixel area; and the fourth pixel area has a first sub-pixel, a second sub-pixel, and a third sub-pixel.

6. A display device comprising a display panel, wherein the display panel is for an organic light emitting diode (OLED) display device, and comprises a plurality of parallel scan lines at intervals and a plurality of parallel data lines at intervals; the data lines and the scan lines cross each other and are insulated from each other; a nth scan line, a (n+1)th scan line, a mth data line, and a (m+1)th data line jointly define a first pixel area; the nth scan line, the (n+1)th scan line, a (m+2)th data line, and a (m+3)th data line jointly define a second pixel area; the nth scan line, the (n+1)th scan line, a (m+4)th data line, and a (m+5)th data line jointly define a third pixel area; each of the first, second, and third pixel areas has at least a sub-pixel unit; the one or more sub-pixel units in the first pixel area and the one or more sub-pixel units in the third pixel area are disposed in a structurally symmetric manner relative to the second pixel area; n is a positive integer greater than or equal to 1; and m is a positive integer greater than or equal to 1; wherein each sub-pixel unit comprises a first sub-pixel, a second sub-pixel, and a third sub-pixel; the first, second, and third sub-pixels are different; the first pixel area and the second pixel area jointly form a first area which has a first sub-pixel, a second sub-pixel, and a third sub-pixel; or the second pixel area and the third pixel area jointly form a second area which has a first sub-pixel, a second sub-pixel, and a third sub-pixel; wherein each first sub-pixel is a red sub-pixel; each second sub-pixel is a green sub-pixel; each third sub-pixel is a blue sub-pixel; and a first sub-pixel, two second sub-pixels, and a third sub-pixel jointly form a pixel group; wherein the second sub-pixel electrically connect to the (m+2)th data line is disposed in the second pixel area; and the second sub-pixel electrically connect to the (m+4)th data line is disposed in the second pixel area.

7. The display device according to claim 6, wherein the (m+1)th data line is electrically connected to a first sub-pixel; the (m+2)th data line is electrically connected to a second sub-pixel; the (m+3)th data line is electrically connected to a third sub-pixel; the (m+4)th data line is electrically connected to another second sub-pixel; and the (m+1)th, (m+2)th, (m+3)th, and (m+4)th data lines jointly drive a pixel group.

8. The display panel according to claim 6, wherein a first sub-pixel and a second sub-pixel are both disposed in the first pixel area, or a first sub-pixel and a second sub-pixel are both disposed in the second pixel area.

9. The display device according to claim 6, wherein each second sub-pixel has an area smaller than that of each first sub-pixel and also smaller than that of each third sub-pixel; and each first sub-pixel has an area smaller than that of each third sub-pixel.

10. The display device according to claim 6, wherein a nth scan line, a (n+2)th scan line, a mth data line, and a (m+1)th data line jointly define a fourth pixel area; and the fourth pixel area has a first sub-pixel, a second sub-pixel, and a third sub-pixel.

* * * * *